US007187710B1

(12) United States Patent
Fulkerson

(10) Patent No.: US 7,187,710 B1
(45) Date of Patent: Mar. 6, 2007

(54) LOW POWER PULSE SIGNALING

(76) Inventor: David E. Fulkerson, 6900 Highover Dr., Chanhassen, MN (US) 55317

( * ) Notice: Subject to any disclaimer, the term of this patent is extended or adjusted under 35 U.S.C. 154(b) by 778 days.

(21) Appl. No.: 10/094,848

(22) Filed: Mar. 11, 2002

Related U.S. Application Data

(60) Provisional application No. 60/311,049, filed on Aug. 8, 2001.

(51) Int. Cl.
*H04B 1/38* (2006.01)

(52) U.S. Cl. ...................................... 375/219
(58) Field of Classification Search ................ 375/219, 375/257, 295, 316, 318; 327/52, 57, 65, 327/96, 108; 330/252–253, 255
See application file for complete search history.

(56) References Cited

U.S. PATENT DOCUMENTS

| 6,025,742 | A  | * | 2/2000 | Chan ........................... 327/108 |
| 6,281,715 | B1 | * | 8/2001 | DeClue et al. ................. 327/65 |
| 6,294,933 | B1 | * | 9/2001 | Chun et al. .................... 326/86 |
| 6,411,131 | B1 | * | 6/2002 | Ang et al. ..................... 327/52 |
| 6,617,892 | B2 | * | 9/2003 | Krishnamurthy et al. ... 327/112 |

OTHER PUBLICATIONS

HyperTransport™ Technology Consortium, HyperTransport™ I/O Link Specification Revision 1.03, Oct. 10, 2001, 29 pages.
Electronic Systems (Technology And Design Perspectives), A Case For Low Voltage Differential Signaling As The Ubiquitous Interconnect Technology, Mar. 1999, 8 pages.

* cited by examiner

*Primary Examiner*—Khanh Tran
(74) *Attorney, Agent, or Firm*—Kinney & Lange, P.A.

(57) ABSTRACT

A system for communicating between integrated circuits is disclosed. The system includes a driver having an input and an output. In response to a logic transition from a first logic state to a second logic state at the driver input, the driver output transitions from a low-power condition, to a transmitting condition, to the low-power condition. The system also includes a receiver having an input and an output. The receiver detects the logic state of the transmitting condition at the driver output and latches it to the receiver output after the driver output returns to the low-power condition. The system also includes a transmission line, which connects the driver output to the receiver input.

29 Claims, 9 Drawing Sheets

LOW POWER PULSE SIGNALING

CROSS-REFERENCE TO RELATED APPLICATION(S)

This application claims priority from Provisional Application No. 60/311,049 filed Aug. 8, 2001, for "Low-Power Pulse Signaling" by D. Fulkerson.

BACKGROUND OF THE INVENTION

The present invention relates to high-speed integrated circuit output/input signaling, and more particularly to a low-power pulse signaling (LPPS) circuit.

A variety of electronic systems rely on improvements in high-speed signaling to increase performance. Networks can operate at higher data rates when signals are propagated more quickly between stations and within network switches. Telephone systems can handle more calls when faster transmission occurs. At high data rates, the media through which signals are transmitted on a printed circuit board or within integrated circuit packages has characteristics similar to the transmission media in the aforementioned systems. Thus, constant improvements to signaling at this level are also necessary.

An example of a conventional circuit approach to high-speed signaling is low-voltage differential signaling (LVDS). This approach is described in more detail in J. Goldie and G. Nicholson, "A case for low voltage differential signaling as the ubiquitous interconnect technology," *Electronic Systems*, March 1999, pp. 39–50, and is herein incorporated by reference. In general, this type of driver employs a differential output signal representing a logic "0" or "1" to drive a dual transmission line. However, with LVDS the differential output constantly remains in a logic state, thus drawing considerable DC power. For example, a dual transmission line employing LVDS is typically terminated with a 100 ohm resistor with a differential voltage of 0.35 V across it. This results in a DC current of 3.5 mA through the resistor, regardless of the logic state of the differential output. Furthermore, additional output buffer circuitry can add to the DC current draw of a system employing LVDS.

Another example of an existing signaling system is HyperTransport I/O, which is described in more detail in "HyperTransport I/O Link Specification, Revision 1-03, Oct. 10, 2001," and is herein incorporated by reference. HyperTransport is similar to LVDS, but HyperTransport has a lower supply voltage and a nominal differential output voltage of 0.6 V, rather than the 0.35 V across a 100 ohm resistor seen in LVDS. Like LVDS, HyperTransport also has a DC current through the output resistor whether the output is a logic "0" or a logic "1"

Another common signaling system employs emitter-coupled logic (ECL). In a typical configuration, an ECL output driver drives a current of about 22 mA when the output is high and about 4 mA when the output is low. Thus, power is continuously dissipated regardless of the logic state of the output of the driver.

There is a need for a high-speed signaling circuit approach that eliminates the continuous power dissipation which occurs in conventional high-speed signaling systems.

BRIEF SUMMARY OF THE INVENTION

The present invention is a system for communicating between integrated circuits. The system includes a driver having an input and an output. In response to a logic transition from a first logic state to a second logic state at the driver input, the driver output transitions from a low-power condition, to a transmitting condition, to the low-power condition. The system also includes a receiver having an input and an output. The receiver detects the logic state of the transmitting condition at the driver output and latches it to the receiver output after the driver output returns to the low-power condition. The system also includes a transmission line, which connects the driver output to the receiver input. The transition from the low-power condition to the transmitting condition and back to the low-power condition is done in a manner that maintains signal integrity at high speed and does not cause undesirable reflections or ringing on the transmission line.

DETAILED DESCRIPTION

Figure 1:
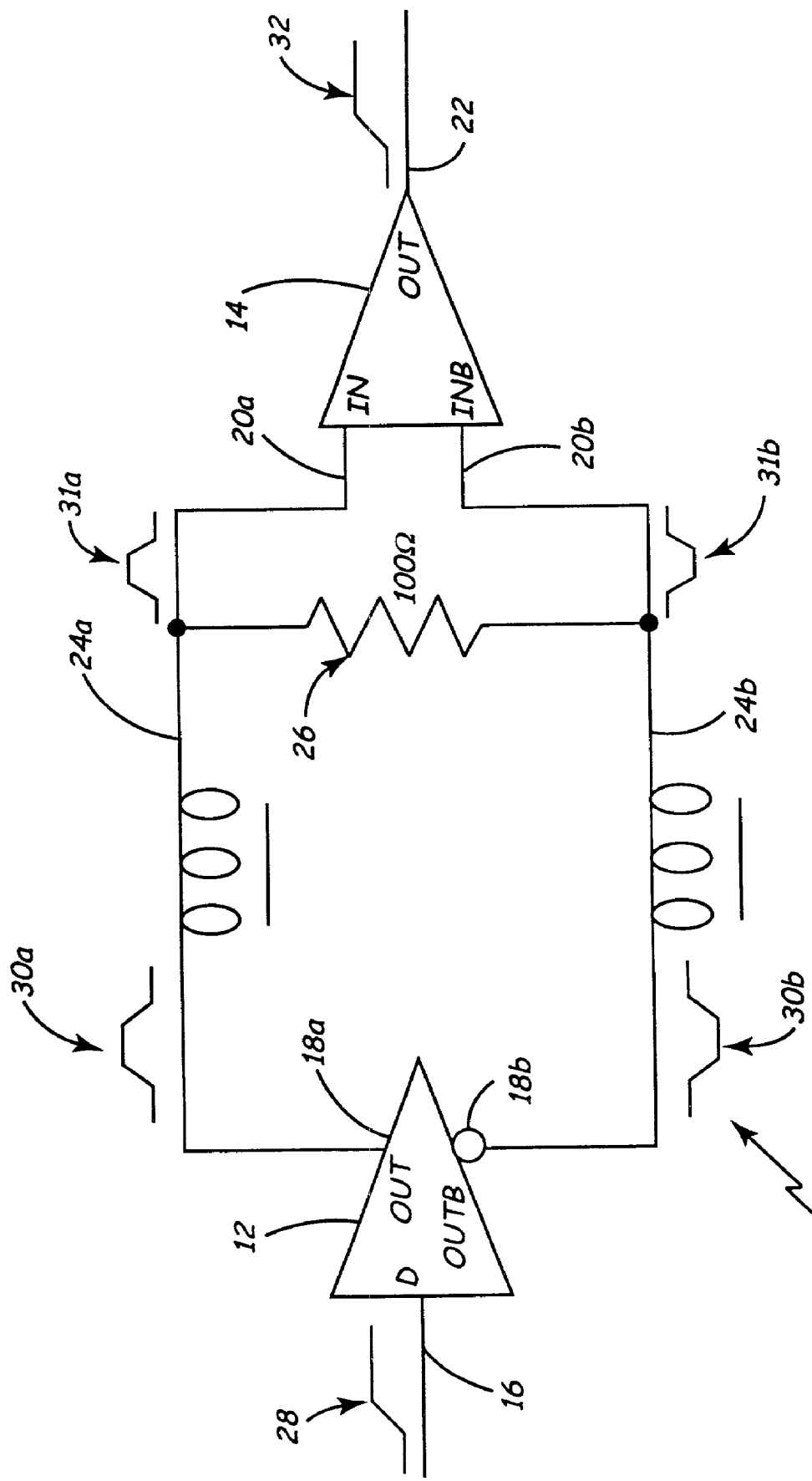
FIG. 1 is a schematic of a low-power pulse signaling system according to a first embodiment of the present invention.

FIG. 1 is a schematic of low-power pulse signaling (LPPS) system 10 for communicating between on-chip or off-chip integrated circuits, according to a first embodiment of the present invention. System 10 includes driver 12 and receiver 14. Driver 12 includes driver input 16, driver output 18a, and inverted driver output 18b. Receiver 14 includes receiver input 20a, inverted receiver input 20b, and receiver output 22. Driver output 18a is connected to receiver input 20a via transmission line 24a. Inverted driver output 18b is connected to inverted receiver input 20b via transmission line 24b. Transmission line 24a and transmission line 24b are terminated by resistor 26 at receiver 14.

In operation of low-power pulse signaling system 10, driver 12 receives signal 28 at driver input 16. Signal 28 is provided by other integrated circuitry (not shown), such as clocking circuitry or data circuitry. When signal 28 changes its logic state (that is, changes from a logic "0" to a logic "1" or from a logic "1" to a logic "0"), driver 12 produces pulse 30a at driver output 18a and inverted pulse 30b at inverted driver output 18b. In this context, a "pulse" means a differential voltage that changes from a low-power non-logic condition (typically near 0 V), to a transmitting logic condition (a positive voltage for a logic "1" or a negative voltage for a logic "0"), and back to the low-power non-logic condition. In the embodiment shown in FIG. 1, the differential voltage of pulse 30a minus pulse 30b represents either a logic "1" or a logic "0," depending on the polarity of the differential voltage. The polarity of the differential voltage pulse depends on the polarity of input signal 28. Pulses 31a and 31b result from pulses 30a and 30b passing through transmission lines 24a and 24b, respectively. Consequently, a differential pulse comprising pulse 31a and pulse 31b arrives at receiver inputs 20a and 20b. Receiver 14 then stores the logic state of the differential pulse received at receiver inputs 20a and 20b, and subsequently outputs signal 32 at receiver output 22. The logic state of signal 32 corresponds to the logic state of pulse 31a minus pulse 31b. Receiver 14 keeps signal 32 at the same logic state until a differential pulse of opposite logic state is received at receiver inputs 20a and 20b. Dual transmission line 24 is terminated by resistor 26 to reduce undesired signal reflections between driver circuit 12 and receiver circuit 14. In a preferred embodiment, resistor 26 is a 100 ohm resistor when the differential characteristic impedance of transmission lines 24a and 24b is 100 ohms.

Compared to prior art high-speed IC output buffer designs, power is saved because driver outputs 18a and 18b return to the low-power non-logic condition after pulses 30 occur.

Figure 2:
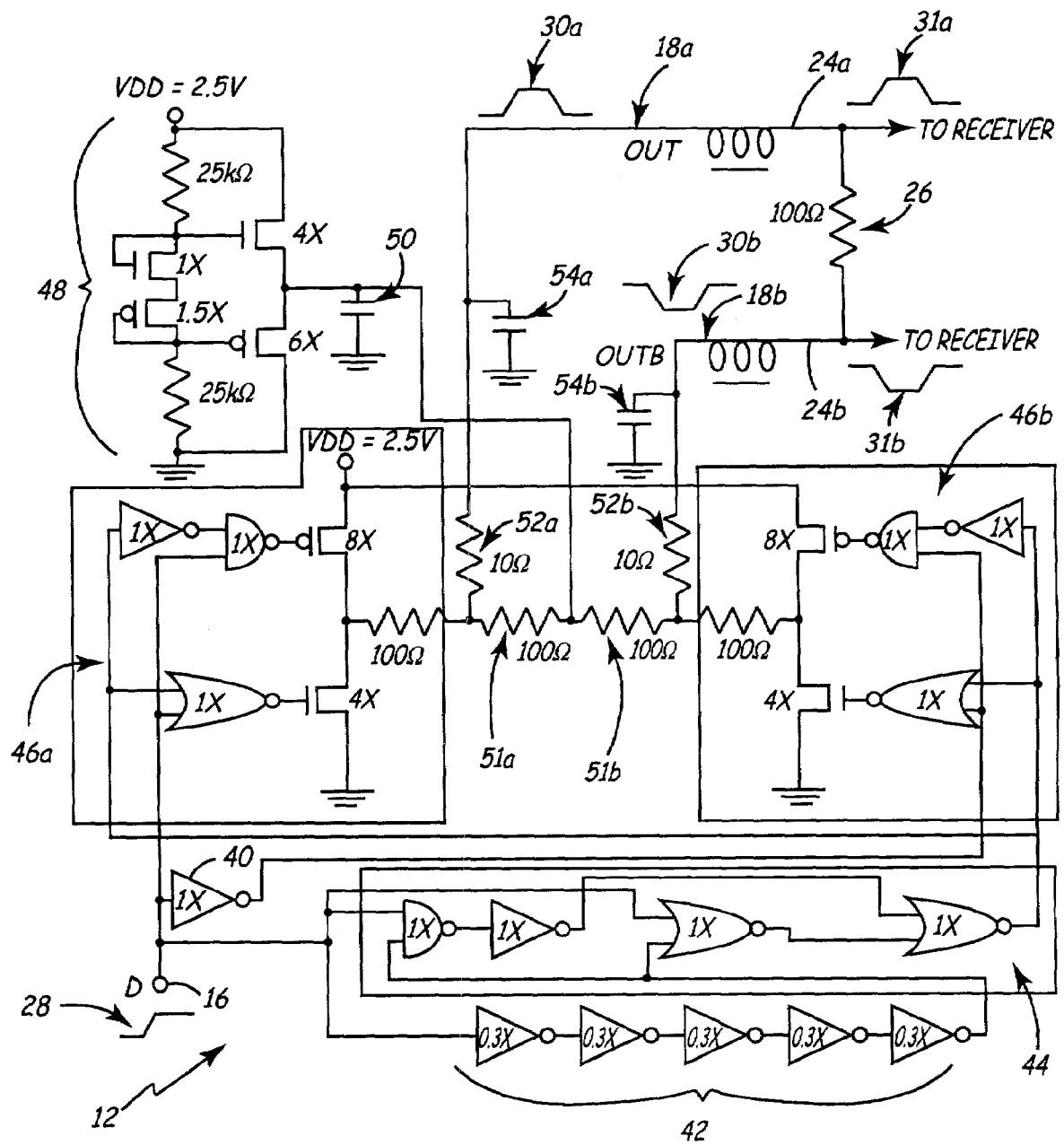
FIG. 2 is a detailed schematic of a first embodiment of the low-power pulse signaling driver circuit of FIG. 1 with a terminated transmission line.

FIG. 2 is a detailed schematic of a first embodiment of low-power pulse signaling driver circuit 12 of FIG. 1 with terminated transmission line 24. Driver circuit 12 includes driver input 16, signal inverter 40, delay inverters 42, pulse logic 44, transistor driver logic 46a, inverted transistor driver logic 46b, low-power common mode voltage circuit 48, capacitor 50, driver terminating resistors 51a and 51b, electrostatic discharge (ESD) resistors 52a and 52b, and ESD parasitic capacitors 54a and 54b.

In operation of driver circuit 12, driver input 16 receives signal 28. As described above, signal 28 is provided by other integrated circuitry (not shown), such as clocking circuitry or data circuitry. While signal 28 maintains a steady logic state, a low-power non-logic state is maintained at outputs 18a and 18b by pulse logic 44, transistor driver logic 46a and inverted transistor driver logic 46b. When signal 28 changes its logic state, a signal having the same logic state as signal 28 propagates through pulse logic 44 and transistor driver logic 46a to driver output 18a. Similarly, a signal having the opposite logic state as signal 28 (due to signal inverter 40) propagates through pulse logic 44 inverted transistor driver logic 46b to inverted driver output 18b. Signal 28 also propagates through delay inverters 42. After signal 28 propagates through delay inverters 42, the resulting signal reaches pulse logic 44. As the signal leaves pulse logic 44, it has a logic state opposite that of signal 28. When the signal reaches transistor driver logic 46a and inverted transistor driver logic 46b, the signals at outputs 18a and 18b return to the low-power non-logic state. Thus, the time of propagation through delay inverters 42 determines the duration that the signal at outputs 18a and 18b remains in the logic state. That is, the duration of pulses 30a and 30b is determined by the delay through delay inverters 42.

In FIG. 2, "1 X" refers to a transistor having a "standard" gate width. As an example, in one typical process, a standard width for an n-channel transistor is seven microns and a standard width for a p-channel transistor is nine microns. Other processes have different standard gate widths. Thus, the inverters of delay inverters 42 have transistor widths 0.3 times the width of a standard transistor, for example. The widths shown in FIG. 2 are preferred widths for a LPPS driver circuit according to the present invention.

Low-power common mode voltage circuit 48 sets the low-power common mode voltage for pulses 30a and 30b at driver outputs 18a and 18b. Alternatively, the common-mode voltage could be supplied by an externally supplied voltage source.

Transmission line 24 is terminated both at driver circuit 12 and at the receiver circuit (not shown in FIG. 2). That is, resistor 51a terminates transmission line 24a at driver circuit 12 and resistor 26 terminates transmission line 24a at the receiver circuit. Similarly, resistor 51b terminates transmission line 24b at driver circuit 12 and resistor 26 terminates transmission line 24b at the receiver circuit. In a preferred embodiment, resistors 51a and 51b are 100 ohm resistors when transmission lines 24a and 24b have a differential characteristic impedance of 100 ohms. The sizes of these resistors were chosen as a compromise between minimizing transmission line reflections and minimizing AC power dissipation. Terminating transmission line 24 at both ends reduces undesired signal reflections.

Further safeguards are employed in driver circuit 12. Capacitor 50 is provided to reduce ringing at the common-mode voltage output. Preferably, capacitor 50 is a 10 pF capacitor. Capacitors 54a and 54b represent the output electrostatic discharge (ESD) protection circuit capacitance plus the load capacitance. Typically, capacitors 54a and 54b are 5 pF capacitors. Finally, resistors 52a and 52b represent the resistances of the output ESD protection circuit. Typically, resistors 52a and 52b are 10 ohm resistors.

Figure 3:
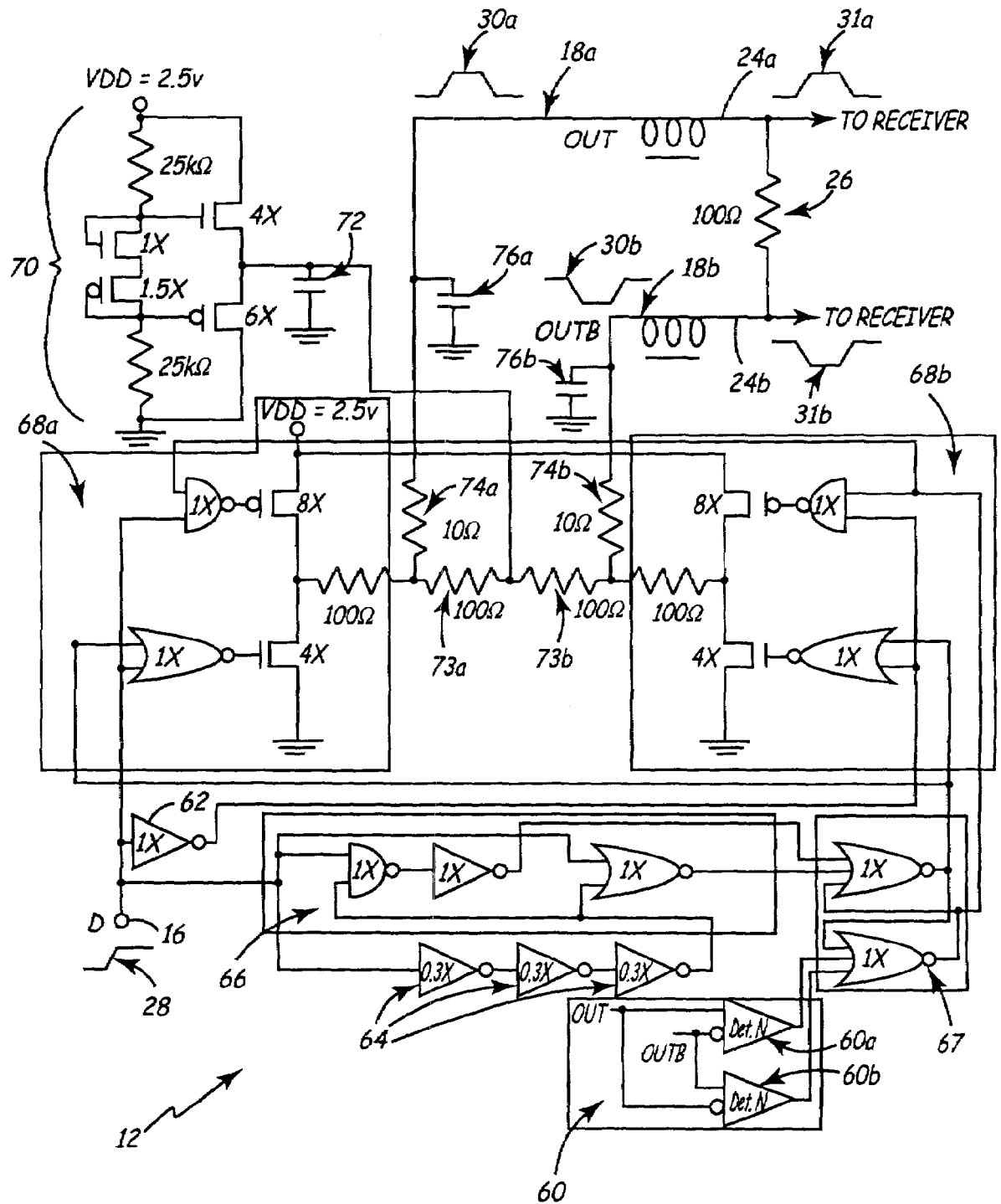
FIG. 3 is a detailed schematic of a second embodiment of the low-power pulse signaling driver circuit of FIG. 1 with a terminated transmission line and an output pulse height detector circuit.

FIG. 3 is a detailed schematic of a second embodiment of low-power pulse signaling driver circuit 12 of FIG. 1 with terminated transmission line 24 and output pulse height detector circuit 60. Driver circuit 12 includes driver input 16, signal inverter 62, delay inverters 64, pulse logic 66, set-reset latch 67, transistor driver logic 68a, inverted transistor driver logic 68b, low-power common mode voltage circuit 70, capacitor 72, driver terminating resistors 73a and 73b, electrostatic discharge (ESD) resistors 74a and 74b, and ESD capacitors 76a and 76b.

In operation of driver circuit 12, driver input 16 receives signal 28. As described above, signal 28 is provided by other integrated circuitry (not shown), such as clocking circuitry or data circuitry. While signal 28 maintains a steady logic state, a low-power non-logic state is maintained at outputs 18a and 18b by transistor driver logic 68a and inverted transistor driver logic 68b, respectively. When signal 28 changes its logic state, a signal having the same logic state as signal 28 propagates through transistor driver logic 68a to driver output 18a. Similarly, a signal having the opposite logic state as signal 28 (due to signal inverter 62) propagates through inverted transistor driver logic 68b to inverted driver output 18b. Signal 28 also propagates through delay inverters 64 and pulse logic 66. After signal 28 propagates through delay inverters 64 and pulse logic 66, the resulting signal reaches set-reset latch 67. This sets set-reset latch 67, causing driver outputs 18a and 18b to change from a low-power non-logic state to a transmitting logic state. That is, driver output 18a switches to the same logic state as that of signal 28, while inverted driver output 18b switches to the opposite logic state. Concurrently, the signals at driver outputs 18a and 18b are passed through output pulse height detector circuit 60, and subsequently to set-reset latch 67. Set-reset latch 67 remains set until driver outputs 18a and 18b reach a magnitude sufficient to switch output pulse height detector 60. When this occurs, set-reset latch 67 is reset, and the signals at driver outputs 18a and 18b return to the low-power non-logic state.

Output pulse height detector 60 detects the pulse height at outputs 15a and 18b using two n-channel or p-channel differential amplifiers 60a and 60b. As the signal at outputs 18 switches to the logic state, output pulse height detector 60 begins to detect to magnitude of the signal at driver outputs 18. Differential amplifiers 60a and 60b will switch when the magnitude of the signal at driver outputs 18a and 18b reaches the magnitude of the predetermined offset voltage of differential amplifiers 60.

In FIG. 3, as in FIG. 2, "1X" refers to a transistor having a "standard" gate width. As an example, in one typical process, a standard width for an n-channel transistors is seven microns and a standard width for a p-channel transistor is nine microns. Other processes have different standard gate widths. Thus, the inverters of delay inverters 64 have transistor widths 0.3 the width of a standard transistor, for example. The widths shown in FIG. 3 are preferred widths for a LPPS driver circuit according to the present invention.

Low-power common mode voltage circuit 70 sets the low-power common mode voltage for pulses 30a and 30b at driver outputs 18a and 18b. Alternatively, the common-mode voltage could be supplied by an externally supplied voltage source.

Transmission line 24 is terminated both at driver circuit 12 and at the receiver circuit (not shown in FIG. 2). That is, resistor 73a terminates transmission line 24a at driver circuit 12 and resistor 26 terminates transmission line 24a at the receiver circuit. Similarly, resistor 73b terminates transmission line 24b at driver circuit 12 and resistor 26 terminates transmission line 24b at the receiver circuit. Preferably, resistors 73a and 73b are 100 ohm resistors when transmission lines 24a and 24b have a differential characteristic impedance of 100 ohms. Terminating transmission line 24 at both ends reduces undesired signal reflections.

Further safeguards are employed in driver circuit 12. Capacitor 72 is provided to reduce ringing at the common-mode voltage output. Typically, capacitor 72 is a 10 pF capacitor. Capacitors 76a and 76b represent the output electrostatic discharge (ESD) protection circuit capacitance plus the load capacitance. Typically, capacitors 76a and 76b are 5 pF capacitors. Finally, resistors 74a and 74b represent the resistances of the output ESD protection circuit. Typically, resistors 74a and 74b are 10 ohm resistors.

Figure 4:
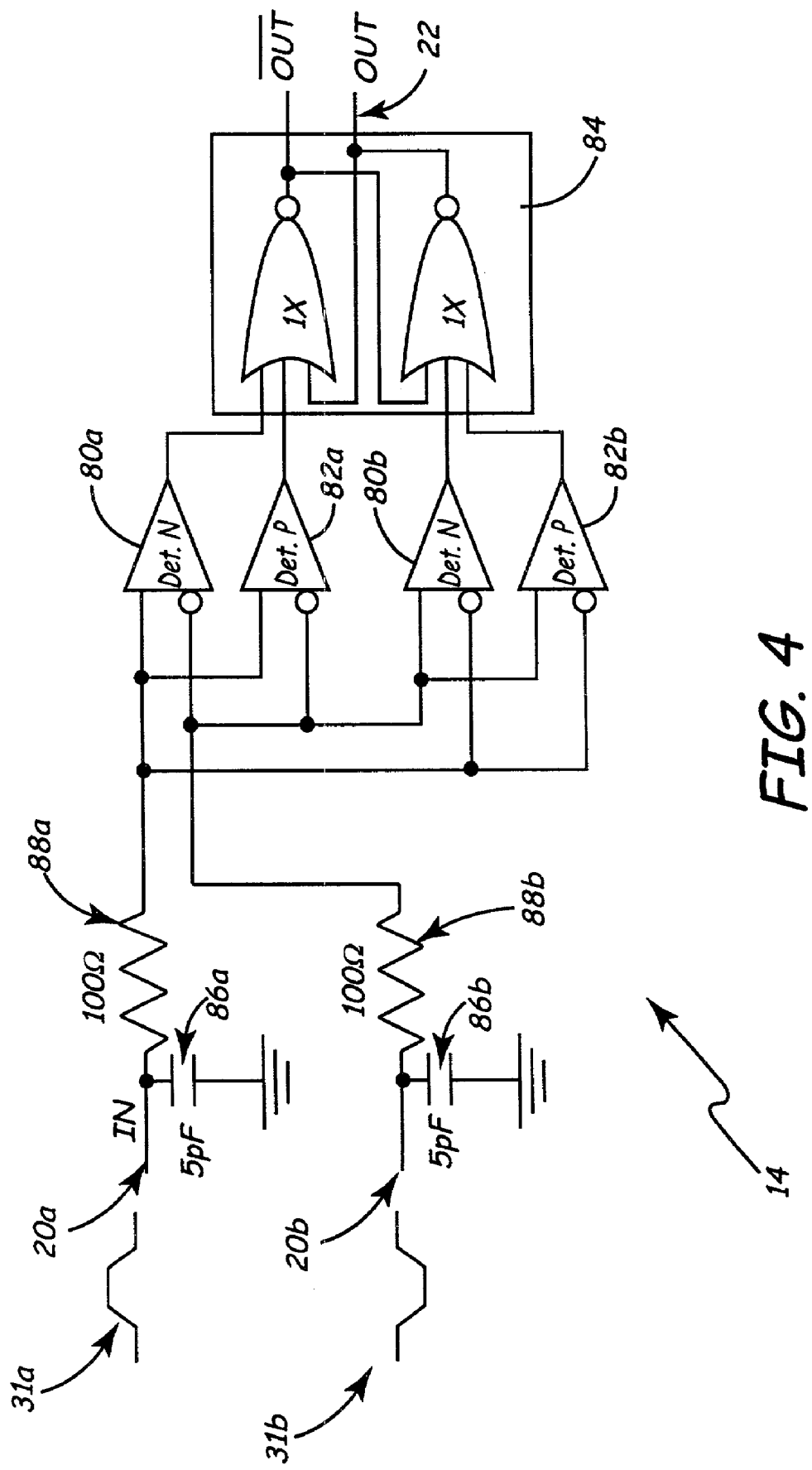
FIG. 4 is a schematic of an exemplary embodiment of the low-power pulse signaling receiver circuit of FIG. 1.

FIG. 4 is a schematic of an exemplary embodiment of low-power pulse signaling receiver circuit 14 of FIG. 1. Receiver circuit 14 includes receiver input 20a, inverted receiver input 20b, n-channel differential amplifiers 80a and 80b, p-channel differential amplifiers 82a and 82b, RS latch 84, ESD capacitors 86a and 86b, and ESD resistors 88a and 88b. ESD capacitors 86a and 86b represent the ESD capacitance plus the load capacitance at receiver inputs 20a and 20b, respectively. ESD resistors 88a and 88b represent the resistances of the input ESD protection circuit. Typically, ESD capacitors 86a and 86b are 5 pF capacitors, and ESD resistors 88a and 88b are 100 ohm resistors.

In operation of receiver circuit 14, pulse 31a and inverted pulse 31b are received at inputs 20a and 20b, respectively. Pulse 31a is sent to one of the two inputs of n-channel differential amplifiers 80a and 80b and p-channel differential amplifiers 82a and 82b. Similarly, inverted pulse 31b is sent to the other of the two inputs of n-channel differential amplifiers 80a and 80b and p-channel differential amplifiers 82a and 82b. Receiver output 22 maintains its logic state until the logic state represented by the differential voltage of pulse 31a minus pulse 31b is opposite the logic state at receiver output 22. Receiver output 22 switches its logic state when the differential voltage between pulse 31a and inverted pulse 31b reaches the offset voltage of n-channel differential amplifiers 80a and 80b and p-channel amplifiers 82a and 82b. The input offset voltage of the differential amplifiers is the differential voltage at which the differential amplifier output will change its output logic state (i.e., change from a logic "0" to a logic "1" or vice versa). The input offset voltage of both n-channel differential amplifiers 80a and 80b and p-channel differential amplifiers 82a and 82b are selectable in a design process well known to the art. In a typical embodiment, the offset voltage of n-channel differential amplifiers 80a and 80b and p-channel differential amplifiers 82a and 82b is 0.1 V. Thus, when the voltage difference between pulse 31a and inverted pulse 31b reaches the preselected offset voltage of the differential amplifiers, RS latch 84 is set, and receiver output 22 changes its output logic state.

Figure 5:
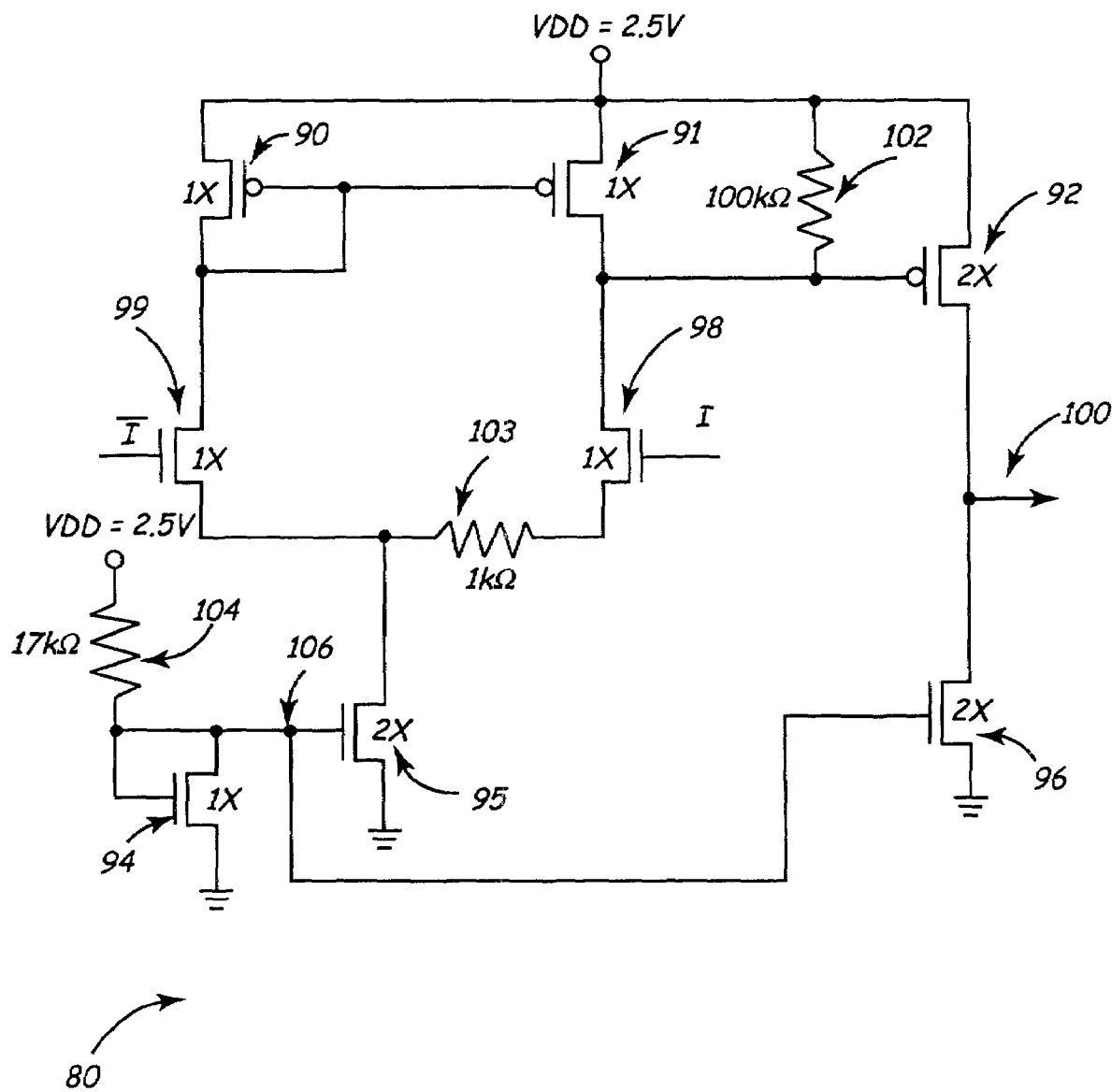
FIG. 5 is a schematic of the n-channel differential amplifier of FIG. 4.
Figure 6:
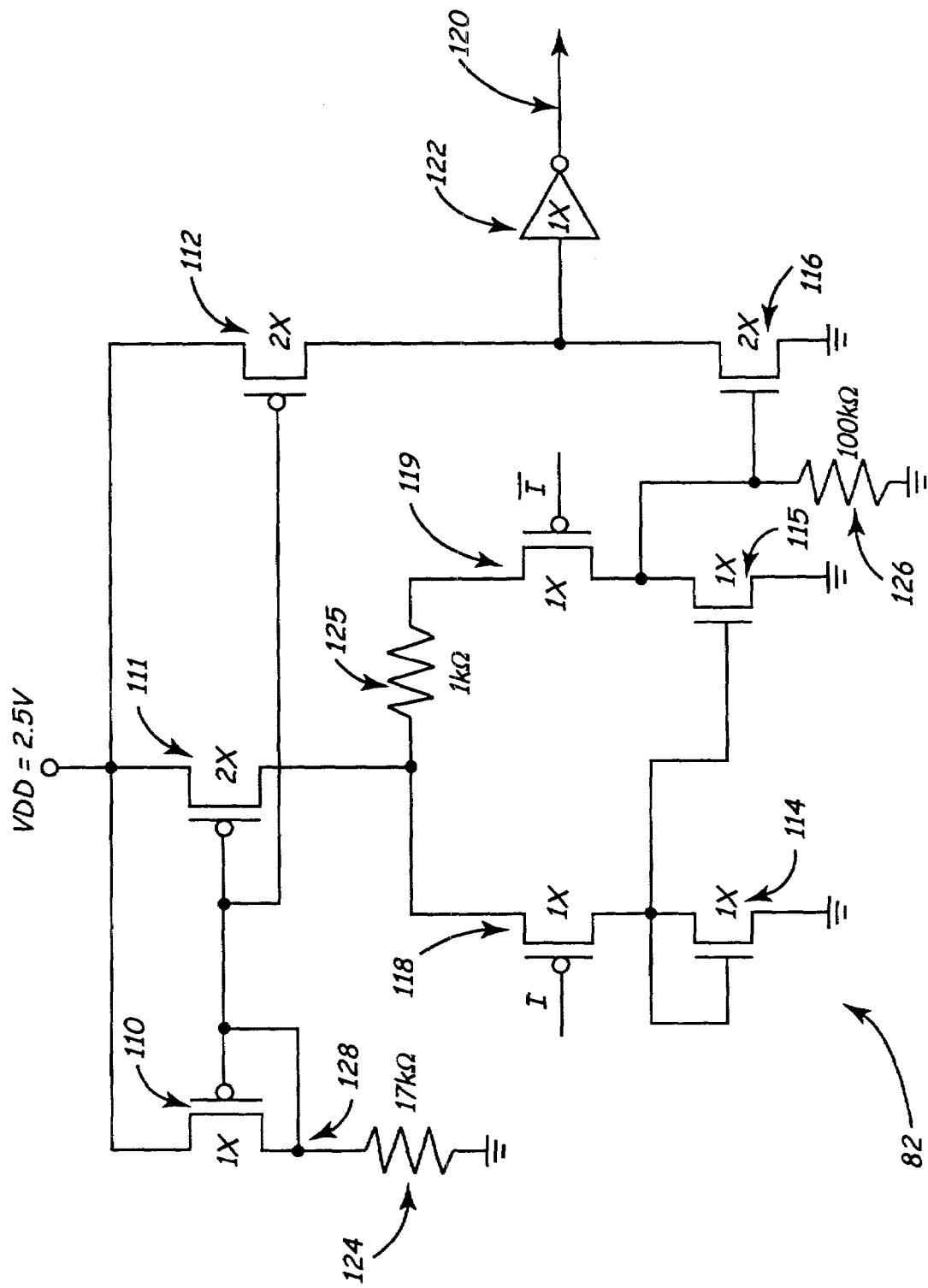
FIG. 6 is a schematic of the p-channel differential amplifier of FIG. 4.

FIG. 5 is a schematic of n-channel differential amplifier 80 (n-channel differential amplifiers 80a and 80b of FIG. 4) and FIG. 6 is a schematic of p-channel differential amplifier 82 (p-channel differential amplifiers 82a and 82b of FIG. 4). N-channel differential amplifier 80 includes p-channel transistors 90, 91, and 92, n-channel transistors 94, 95, and 96, n-channel input transistors 98 and 99, output 100, and resistors 102, 103, and 104. Transistor 94 and resistor 104 form a common current source for n-channel differential amplifiers 80a and 80b of FIG. 4. Thus, n-channel differential amplifiers 80a and 80b are connected at common node 106. P-channel differential amplifier 82 includes p-channel transistors 110, 111, and 112, n-channel transistors 114, 115, and 116, p-channel input transistors 118 and 119, output 120, output inverter 122, and resistors 124, 125, and 126. Transistor 110 and resistor 124 form a common current source for p-channel differential amplifiers 82a and 82b of FIG. 4. Thus, p-channel differential amplifiers 82a and 82b are connected at common node 128.

N-channel differential amplifier 80 is designed using n-channel input transistors 98 and 99, and thus operate well when the common mode input voltage range is relatively high. Conversely, p-channel differential amplifier 82 is designed using p-channel input transistors 118 and 119, and thus operate well when the common mode input voltage range is relatively low. Receiver 14 of FIG. 5 includes both n-channel differential amplifiers 80a and 80b and p-channel differential amplifiers 82a and 82b to assure detection of pulses 31a and 31b whether the input common mode voltage of differential amplifiers 80 and 82 is low, high, or in between.

As stated above, differential amplifiers 80 and 82 are typically designed to have an input offset voltage of approximately 0.1 V, in a design process well known to the art. That is, differential amplifiers 80 and 82 will switch when the differential input voltage is 0.1 V. Thus, with reference to n-channel differential amplifier 80 of FIG. 5, a logic "1" appears at output 100 when the differential voltage between the gates of input transistors 98 and 99 is 0.1 V. This sets RS latch 84 of FIG. 4, resulting in a logic "1" signal at receiver output 22. Similarly, with reference to p-channel differential amplifier 82 of FIG. 6, a logic "1" appears at output 120 when the differential voltage between the gates of input transistors 118 and 119 is 0.1 V. This also sets RS latch 84 of FIG. 4, resulting in a signal having a logic "1" at receiver output 22. The logic state at receiver output 22 remains unchanged until a differential signal having an opposite logic state is received at receiver inputs 20a and 20b.

Figure 7:
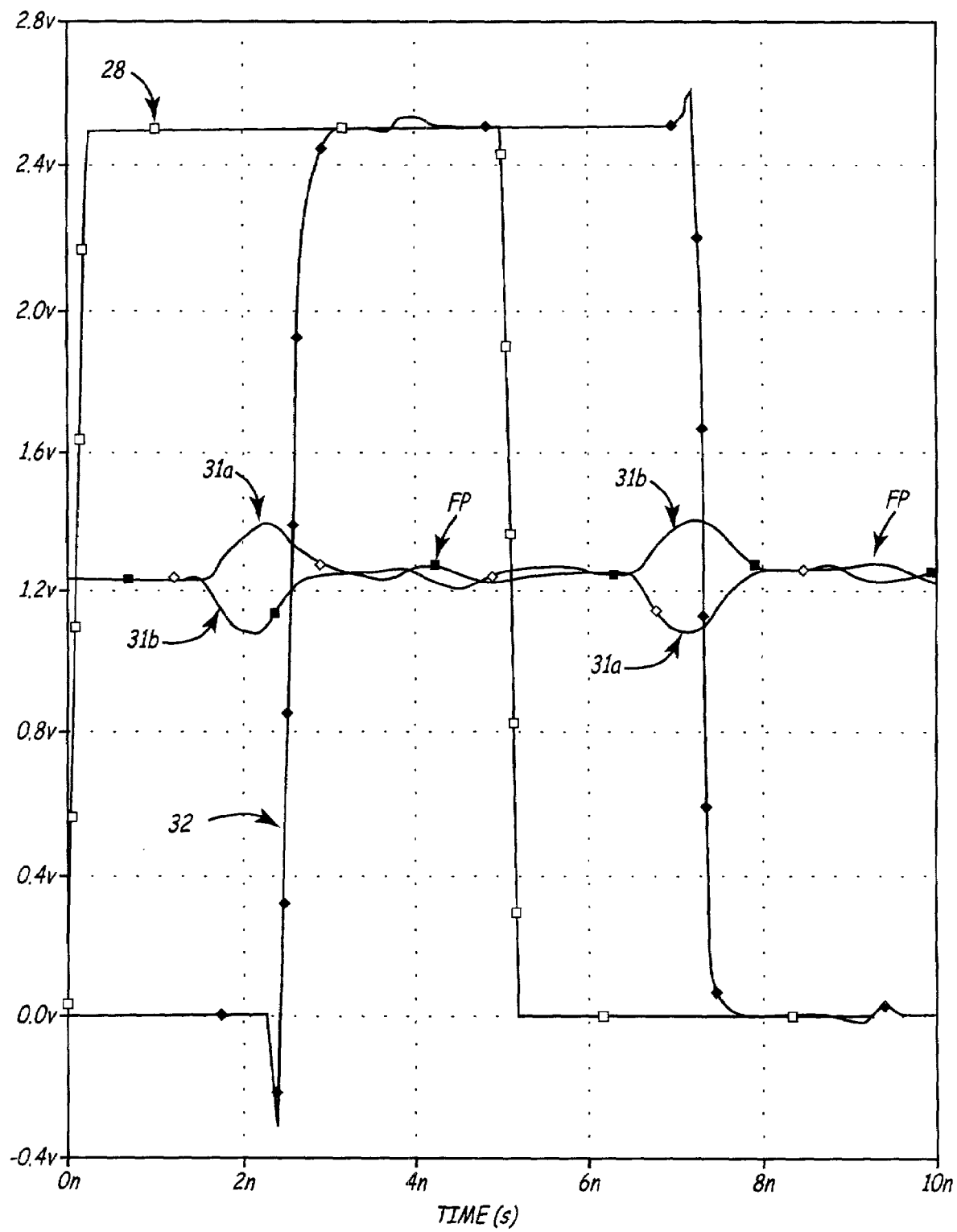
FIG. 7 is a graph showing input and output voltage waveforms of the low-power pulse signaling system of FIG. 1.
Figure 8:
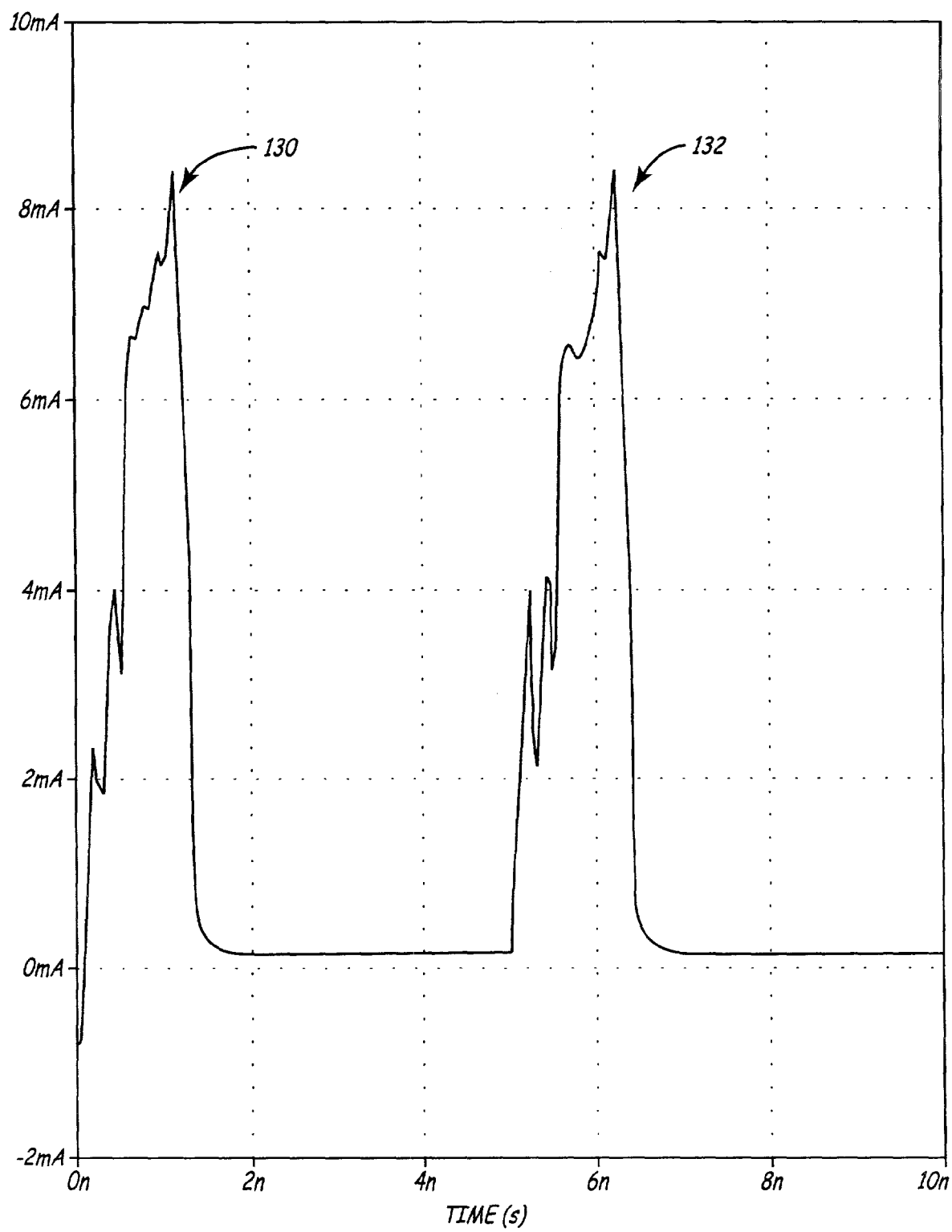
FIG. 8 is a graph showing the power supply current draw of the low-power pulse signaling system of FIG. 1.

FIG. 7 is a graph showing simulated input and output voltage waveforms, and FIG. 8 is a graph showing the simulated power supply current draw, of low-power pulse signaling output buffer 12. The transistor models used for the simulation graphs shown in FIGS. 7 and 8 were representative of a typical CMOS process with 0.35 micron gate lengths. The graphs of FIGS. 7 and 8 show the simulated functionality of low-power pulse signaling system 10, and are best understood when viewed in conjunction with one another. As explained above, low-power pulse signaling system 10 operates when signal 28 changes logic state. Thus, when signal 28 changes from a logic "0" to a logic "1" (in this example, from 0 V to 2.5 V), pulse 30a, having the same logic state as signal 28, is produced on transmission line 24a, and inverted pulse 30b is produced on transmission line 24b. FIG. 7 shows pulses 31a and 31b, which occur at receiver inputs 20a and 20b. Signal 32, which is the signal at receiver output 22, makes a logic transition when the differential voltage of pulses 31a and 31b exceeds the differential offset voltage of receiver 14 (0.1 V in this preferred embodiment). Thus, in this simulation, signal 32 transitions from a logic "0" to a logic "1" when the differential voltage of pulses 31a and 31b exceeds +0.1 V. Similarly, signal 32 transitions from a logic "1" to a logic "0" when the differential voltage of pulses 31a and 31b is less than −0.1 V. Also of note in FIG. 7 are false polarities FP that occur after the larger signals on pulses 31a and 31b. False polarities FP are caused by reflections on transmission lines 24a and 24b. However, in order to be detected by the receiver (and consequently force a logic transition at receiver output 22), false polarities FP would have to exceed the differential offset voltage of receiver 14 for a duration of time determined by the receiver design. As shown in FIG. 7, the unwanted detection of false polarities FP does not occur. With reference to FIG. 8, which shows current draw from the power supply of driver 12, current spikes 130 and 132 occur when a logic transition occurs in signal 28, but returns to a small value (near 0 mA) after pulses 30 occur. Thus, low-power pulse signaling system 10 relays signal 28 to other on-chip or off-chip circuits while keeping current draw from the power supply at a minimum.

Figure 9:
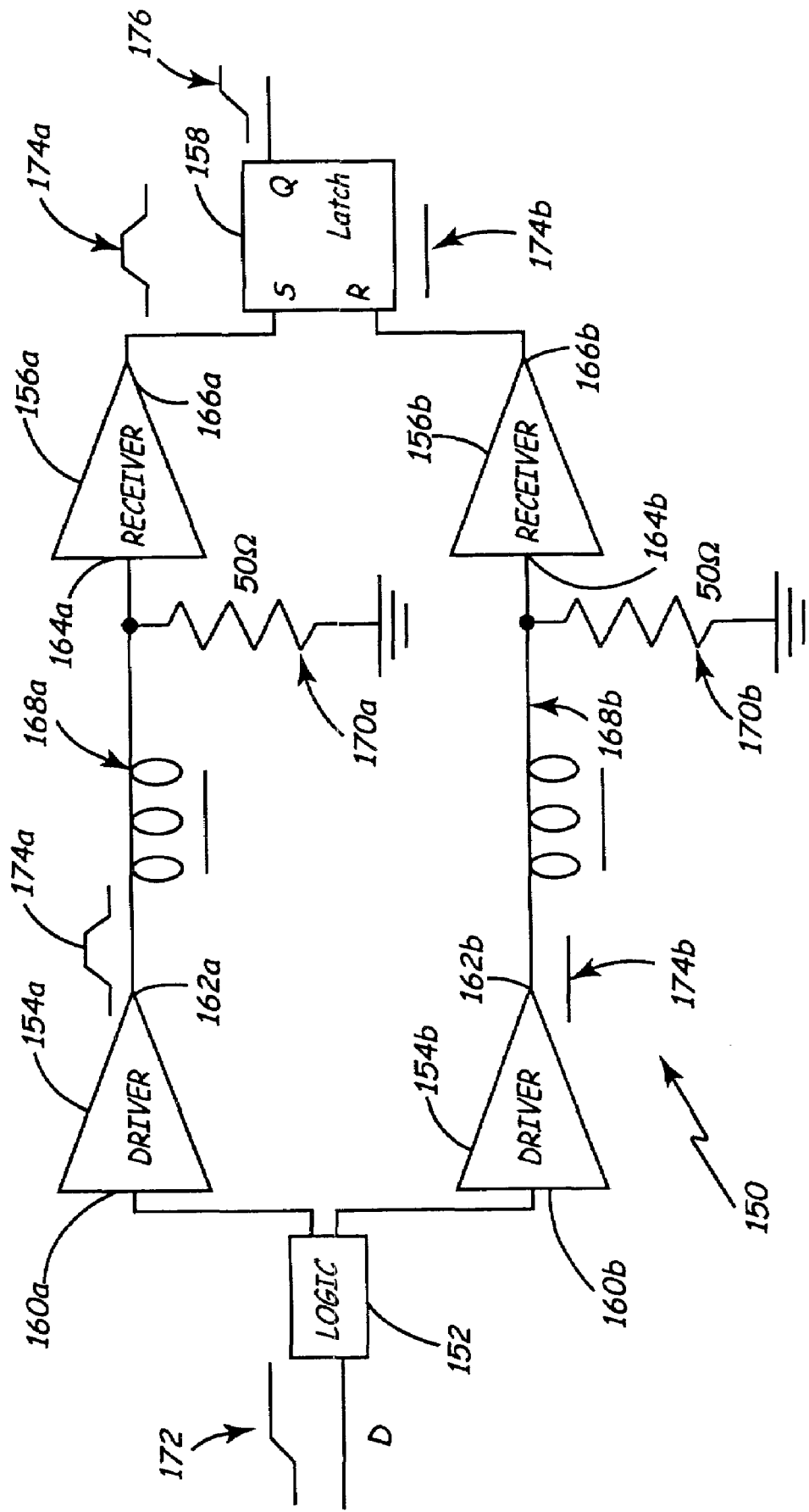
FIG. 9 is a schematic of a low-power pulse signaling system according to a second embodiment of the present invention.

FIG. 9 is a schematic of a low-power pulse signaling system 150 for communicating between on-chip or off-chip integrated circuits, according to a second embodiment of the present invention. System 150 includes logic 152, drivers 154a and 154b, receivers 156a and 156b, and RS latch 158. Driver 154a includes driver input 160a and driver output 162a, and driver 154b includes driver input 160b and driver output 162b. Receiver 156a includes receiver input 164a and receiver output 166a, and receiver 166b includes receiver input 164b and receiver output 166b. The output of logic 152 is connected to driver inputs 160a and 160b. Driver output 162a is connected to receiver input 164a via transmission line 168a, and driver output 162b is connected to receiver input 164b via transmission line 168b. Transmission line 168a and transmission line 168b are terminated by resistor 170a and resistor 170b, respectively. Receiver outputs 176 are connected to RS latch 158.

In operation of system 150, logic 152 receives signal 172 at its input. Signal 172 is provided by other integrated circuitry (not shown), such as clocking circuitry or data circuitry. When signal 172 changes its logic state (that is, changes from a logic "0" to a logic "1" or from a logic "1" to a logic "0"), logic 152 outputs signal 172 to one of drivers 160a or 160b. Specifically, if signal 172 changes from a logic "0" to a logic "1" at the input of logic 152, then signal 172 is relayed to driver input 160a by logic 152. Similarly, if signal 172 changes from a logic "1" to a logic "0" at the input of logic 152, then signal 172 is relayed to driver input 160b. If signal 172 is received by driver 154a, driver 154a produces pulse 174a at driver output 162a. If signal 172 is received by driver 154b, driver 154b produces pulse 174b at driver output 162b. In this context, a "pulse" means an output that changes from a low-power logic "0," to a higher-power logic "1," and back to the low-power logic "0". Pulse 174a is received at receiver input 164a, or pulse 174b is received at receiver input 164b. Receiver 156a or 156b then detects the logic state of the pulses received at receiver input 164a or 164b, respectively, and subsequently outputs pulse 174a or 174b, respectively, to RS latch 158. RS latch 158 subsequently outputs signal 176 at the output of RS latch 158. The logic state of signal 176 corresponds to the logic state of signal 172. RS latch 158 keeps signal 176 at the same logic state until pulse 174a or 174b of opposite logic state is received at receiver inputs 164a or 164b. Transmission lines 168a and 168b are terminated by resistors 170a and 170b, respectively, to reduce undesired signal reflections between driver circuits 154 and receiver circuits 156. Preferably, resistors 170a and 170b are 50 ohm resistors when transmission lines 168a and 168b have a differential characteristic impedance of 100 ohms.

The present invention, low-power pulse signaling, is a circuit design that reduces power dissipation in output/input systems in high speed integrated circuits. In operation, when the logic state of the signal remains unchanged at the input of the output buffer (driver), the low-power pulse signaling circuit remains in a low power non-logic state. This reduces the amount of power that is drawn by the low-power pulse signaling circuit when the signal remains unchanged at the driver input. When the logic state of the signal changes at the input of the driver, the driver circuitry converts the signal into a pulse having the same logic state as the input signal. This pulse signal is propagated to the input buffer (receiver) circuitry of the low-power pulse signaling circuit, wherein the pulse signal is converted to a signal identical to that which appeared at the input of the driver. This signal is then presented at the output of the low-power pulse signaling circuit. The low-power pulse signaling circuit is subsequently returned to the low power non-logic state. Compared to previous high speed IC signaling circuits, power is saved because the output pulse of the driver circuit returns to a low-power state after the logic pulse occurs. Furthermore, since the output of the receiver stays in the same logic state until it receives another incoming pulse having an opposite polarity, the logic system following the receiver can remain unchanged and can treat the data in the same as in conventional signaling systems.

Although the present invention has been described with reference to preferred embodiments, workers skilled in the art will recognize that changes may be made in form and detail without departing from the spirit and scope of the invention. For example, the sizes of the resistors, capacitors, and transistors depicted in the figures may be changed as needed to satisfy circuit-specific design requirements.

The invention claimed is:

1. A system for communicating between integrated circuits comprising:
  a driver having an input and an output, wherein in response to a logic transition at the driver input, the driver output transitions from a low-power condition that does not represent and is not recognizable as a logic state, to a transmitting condition having a logic state based upon the logic transition, and then to the low-power condition until a next logic transition at the driver input;

a receiver, having an input and an output, which detects the logic state of the transmitting condition at the driver output and maintains the logic state on the receiver output after the driver output returns to the low-power condition; and transmission line means for connecting the driver output to the receiver input.

2. The system of claim 1, wherein the transition from the low-power condition, to the transmitting condition, to the low-power condition at the output of the driver circuit comprises a differential pulse.

3. The system of claim 2, wherein the low-power condition has a differential voltage of about zero volts.

4. The system of claim 1, wherein the transition from the low-power condition, to the transmitting condition, to the low-power condition at the output of the driver circuit comprises a single-ended pulse.

5. The system of claim 4, wherein the logic state of the transmitting condition corresponds with the logic state after the logic transition at the driver input.

6. The system of claim 4, wherein the low-power condition is represented by a voltage intermediate the logic state before the logic transition and the logic state after the logic transition.

7. The system of claim 1, wherein the transmission line means is on a circuit board.

8. The system of claim 1, wherein the transmission line means is on an integrated circuit package containing at least one integrated circuit.

9. The system of claim 1, wherein the transmission line means is an integrated circuit wire.

10. The system of claim 1, wherein the transmission line means is an electronic bus.

11. The system of claim 1, wherein the transmission line means is terminated at the driver circuit.

12. The system of claim 1, wherein the transmission line means is terminated at the receiver circuit.

13. The system of claim 1, wherein the transmission line means is terminated both at the driver circuit and at the receiver circuit.

14. The system of claim 1, further comprising:
time-delay means for setting a duration of the transmitting condition at the output of the driver circuit.

15. The system of claim 14, wherein the time-delay means is a plurality of inverters connected in series.

16. The system of claim 1, further comprising:
sensing means for determining a voltage magnitude of the transmitting condition at the output of the driver circuit.

17. The system of claim 16, wherein the driver output transitions to the low-power condition when the sensing means senses the voltage magnitude of the transmitting condition to be at a selected level.

18. A driver for transmitting a pulsed differential signal from one integrated circuit to another integrated circuit, the driver comprising:
an input;
a pair of outputs; and
a circuit connecting the input to the outputs which, in response to a logic transition at the input, produces a differential pulse at the outputs which transitions from a low-power condition that does not represent and is not recognizable as a logic state, to a transmitting condition having a logic state based upon the logic transition, and then to the low-power condition until a next logic transition at the driver input.

19. The driver of claim 18, wherein the transition from the low-power condition, to the transmitting condition, to the low-power condition at the outputs comprises a differential pulse.

20. The driver of claim 19, wherein the low-power condition has a differential voltage of about zero volts.

21. The driver of claim 18 wherein the transition from the low-power condition, to the transmitting condition, to the low-power condition at each of the outputs comprises a single-ended pulse.

22. The driver of claim 21, wherein the logic state of the transmitting condition corresponds with the logic state after the logic transition at the driver input.

23. The driver of claim 21, wherein the low-power condition is represented by a voltage intermediate the logic state before the logic transition and the logic state after the logic transition.

24. The driver of claim 18, further comprising:
time-delay means for setting a duration of the transmitting condition at the outputs.

25. The driver of claim 24, wherein the time-delay means is a plurality of inverters connected in series.

26. The driver of claim 18, further comprising:
sensing means for determining a voltage magnitude of the transmitting condition at the outputs.

27. The driver of claim 26, wherein the outputs transition to the low-power state when the sensing means senses the voltage magnitude of the transmitting condition to be at a selected level.

28. An integrated circuit receiver comprising:
a pair of inputs for receiving a pulsed differential signal, wherein the pulsed differential signal transitions from a low-power condition that does not represent and is not recognizable as a logic state, to a transmitting condition having a logic state, and then to the low-power condition;
an output; and
a circuit which, upon receiving the pulsed differential signal at the inputs, detects the logic state of the pulsed differential signal and maintains the logic state on the output after the pulsed differential signal returns to the low-power condition until the pulsed differential signal again transitions from the low-power condition to the transmitting condition.

29. The integrated circuit receiver of claim 28, wherein the circuit comprises:
a plurality of amplifiers connected to the pair of inputs; and
a latch connected to the plurality of amplifiers.

* * * * *